(12) United States Patent
Abrams

(10) Patent No.: US 11,892,307 B2
(45) Date of Patent: Feb. 6, 2024

(54) STRANDING AND SCOPING ANALYSIS FOR AUTONOMOUS VEHICLE SERVICES

(71) Applicant: Waymo LLC, Mountain View, CA (US)

(72) Inventor: Austin Abrams, Redwood City, CA (US)

(73) Assignee: Waymo LLC, Mountain View, CA (US)

(*) Notice: Subject to any disclaimer, the term of this patent is extended or adjusted under 35 U.S.C. 154(b) by 92 days.

(21) Appl. No.: 17/381,276

(22) Filed: Jul. 21, 2021

(65) Prior Publication Data

US 2021/0348933 A1    Nov. 11, 2021

Related U.S. Application Data

(63) Continuation of application No. 16/387,098, filed on Apr. 17, 2019, now Pat. No. 11,105,642.

(51) Int. Cl.
*G01C 21/34* (2006.01)
*G06F 30/20* (2020.01)

(52) U.S. Cl.
CPC ..... *G01C 21/3461* (2013.01); *G01C 21/3438* (2013.01); *G06F 30/20* (2020.01)

(58) Field of Classification Search
CPC .......................... G05D 1/0214; G01C 21/3461
See application file for complete search history.

(56) References Cited

U.S. PATENT DOCUMENTS

| 8,706,394 B2 | 4/2014 | Trepagnier et al. |
| 9,612,123 B1 | 4/2017 | Levinson et al. |

(Continued)

FOREIGN PATENT DOCUMENTS

| CN | 102334151 A | 1/2012 |
| CN | 103339010 A | 10/2013 |

(Continued)

OTHER PUBLICATIONS

The Extended European Search Report for European Patent Application No. 20791428.4, dated Nov. 17, 2022, 7 Pages.

(Continued)

*Primary Examiner* — Russell Frejd
*Assistant Examiner* — Ana D Thomas
(74) *Attorney, Agent, or Firm* — Botos Churchill IP Law

(57) ABSTRACT

Aspects of the disclosure provide for identifying problematic areas within a service area for an autonomous vehicle transportation service. For instance, a starting location within the service area corresponding to a potential pickup location for passengers or cargo for the service may be identified. A destination within the service area may be identified. A simulation may be run in order to determine a route for a simulated vehicle to travel between the starting location and the destination. That the route includes a particular type of maneuver may be determined. A new simulation without allowing the simulated vehicle to complete the particular type of maneuver may be run. Whether the simulated vehicle reaches the destination in the new simulation may be determined. Based on the determination of whether the simulated vehicle reaches the destination in the new simulation, the starting location and destination location may be flagged as potentially problematic areas.

24 Claims, 11 Drawing Sheets

(56) References Cited

U.S. PATENT DOCUMENTS

| | | | |
|---|---|---|---|
| 9,940,651 B2 | 4/2018 | Ross et al. | |
| 2011/0046883 A1* | 2/2011 | Ross | G01C 21/005 |
| | | | 701/533 |
| 2012/0116666 A1 | 5/2012 | Maekelae | |
| 2014/0278052 A1 | 9/2014 | Slavin et al. | |
| 2017/0123421 A1 | 5/2017 | Kentley | |
| 2017/0123429 A1 | 5/2017 | Levinson et al. | |
| 2017/0308093 A1 | 10/2017 | Urano et al. | |
| 2018/0024553 A1* | 1/2018 | Kong | B60W 30/0953 |
| | | | 701/26 |
| 2018/0129220 A1 | 5/2018 | Beach et al. | |
| 2018/0238697 A1 | 8/2018 | Maru et al. | |
| 2018/0308191 A1 | 10/2018 | Matthiesen et al. | |
| 2018/0329428 A1 | 11/2018 | Nagy et al. | |
| 2018/0348001 A1 | 12/2018 | Aggarwal et al. | |
| 2019/0278290 A1* | 9/2019 | Zhang | G01S 7/40 |
| 2019/0303759 A1* | 10/2019 | Farabet | G06F 9/455 |
| 2020/0208998 A1* | 7/2020 | Xiang | G06F 16/29 |
| 2020/0233415 A1 | 7/2020 | Panzica et al. | |
| 2020/0310450 A1* | 10/2020 | Reschka | B60W 60/0011 |

FOREIGN PATENT DOCUMENTS

| | | |
|---|---|---|
| CN | 103674046 A | 3/2014 |
| CN | 102768807 B | 9/2014 |
| CN | 105074793 A | 11/2015 |
| CN | 107024218 A | 8/2017 |
| CN | 107121980 A | 9/2017 |
| CN | 108287541 A | 7/2018 |
| CN | 109144053 A | 1/2019 |
| JP | 2016513805 A | 5/2016 |
| JP | 2018136198 A | 8/2018 |
| WO | 2014152554 A1 | 9/2014 |

OTHER PUBLICATIONS

PCT International Search Report and Written Opinion for Application No. PCT/US2020/028291 dated Jul. 30, 2020.
Notice of Reasons for Rejection for Japanese Patent Application No. 2021-557968, dated Oct. 4, 2022.
Notice of Allowance for Chinese Patent Application No. 202080029264.3, dated May 30, 2022.

* cited by examiner

STRANDING AND SCOPING ANALYSIS FOR AUTONOMOUS VEHICLE SERVICES

CROSS REFERENCE TO RELATED APPLICATIONS

The present application is a continuation of U.S. patent application Ser. No. 16/387,098, filed Apr. 17, 2019, the entire disclosure of which is incorporated herein by reference.

BACKGROUND

Autonomous vehicles, such as vehicles that do not require a human driver, can be used to aid in the transport of passengers or items from one location to another. Such vehicles may operate in a fully autonomous mode where users may provide some initial input, such as a pickup or destination location, and the vehicle maneuvers itself to that location. When a person (or user) wants to be physically transported and/or to transport goods between two locations via a vehicle, they may use any number of taxi or delivery services. To date, these services typically involve a human driver who is given dispatch instructions to a location to pick up and drop off the user and/or goods. In many instances, human drivers may tend to take the fastest or most direct route to the destination location. However, in the case of autonomous vehicles, where some areas may be "off-limits" for one reason or another, this may not always be possible and may sometimes result in strandings or rather, situations in which the vehicle is not able to reach its destination or some other location.

BRIEF SUMMARY

One aspect of the disclosure provides a method of identifying problematic areas within a service area for an autonomous vehicle transportation service. The method includes identifying, by one or more processors, a starting location within the service area corresponding to a potential pickup location for passengers or cargo for the service; identifying, by the one or more processors, a destination location within the service area for the starting location; running, by the one or more processors, a simulation to determine a route for a simulated vehicle to travel between the starting location and the destination location; determining, by the one or more processors, that the determined route includes a particular type of maneuver; running, by the one or more processors, a new simulation without allowing the simulated vehicle to complete the particular type of maneuver; determining, by the one or more processors, whether the simulated vehicle reaches the destination location in the new simulation; and based on the determination of whether the simulated vehicle reaches the destination location in the new simulation, flagging, by the one or more processors, at least one of the starting location or the destination location as potentially problematic areas.

In one example, the method also includes running a set of simulations for the starting location by identifying a plurality of destination locations for the starting location and determining routes between the starting location and each of the plurality of destination locations; identifying ones of the determined routes that include the particular type of maneuver; running a set of new simulations without allowing the simulated vehicle to complete the particular type of maneuver; and determining whether the simulated vehicle reaches the destination location in each of the set of new simulations, and wherein flagging is further based on the determination of whether the simulated vehicle reaches the destination location in each of the set of new simulations. In this example, flagging the starting location is further based on a comparison a number of new simulations where the simulated vehicle does not the destination location to a threshold value. In another example, the service area includes a boundary across which the simulated vehicle is unable to cross, and wherein determining the simulated vehicle reaches the destination location in the new simulation is based on whether the simulated vehicle becomes stranded by the boundary. In another example, the starting location is identified by randomly selecting a location within the service area. In another example, the starting location is identified from a plurality of predetermined pickup and drop off locations within the service area. In this example, the starting location is identified from the plurality of predetermined pickup and drop off locations randomly. Alternatively, the starting location is identified from the plurality of predetermined pickup and drop off locations in order to test a specific area within the service area. In another example, the destination location is identified from a plurality of predetermined pickup and drop off locations within the service area. In another example, the simulation is run using a routing system software stack for an autonomous vehicle to determine the determined route. In another example, the particular type of maneuver is changing lanes. In another example, the method also includes flagging a plurality of problematic areas and drawing a polygon around the plurality of problematic areas and the starting location.

Another aspect of the disclosure provides a system for identifying problematic areas within a service area for an autonomous vehicle transportation service. The system includes one or more server computing devices having one or more processors configured to: identify a starting location within the service area corresponding to a potential pickup location for passengers or cargo for the service; identify a destination location within the service area for the starting location; run a simulation to determine a route for a simulated vehicle to travel between the starting location and the destination location; determine that the determined route includes a particular type of maneuver; run a new simulation without allowing the simulated vehicle to complete the particular type of maneuver; determine whether the simulated vehicle reaches the destination location in the new simulation; and based on the determination of whether the simulated vehicle reaches the destination location in the new simulation, flag at least one of the starting location or destination location as potentially problematic areas.

In one example, the one or more processors are further configured to: run a set of simulations for the starting location by identifying a plurality of destination locations for the starting location and determining routes between the starting location and each of the plurality of destination locations; identify ones of the determined routes that include the particular type of maneuver; run a set of new simulations without allowing the simulated vehicle to complete the particular type of maneuver; and determine whether the simulated vehicle reaches the destination location in each of the set of new simulations, and wherein flagging is further based on the determination of whether the simulated vehicle reaches the destination location in each of the set of new simulations. In another example, the service area includes a boundary across which the simulated vehicle is unable to cross, and wherein determining the simulated vehicle reaches the destination location in the new simulation is based on whether the simulated vehicle becomes stranded by the boundary. In another example, the starting location is identified by randomly selecting a location within the service area. In another example, the starting location is identified from a plurality of predetermined pickup and drop off locations within the service area. In another example, the destination location is identified from a plurality of predetermined pickup and drop off locations within the service area. In another example, the simulation is run using a routing system software stack for an autonomous vehicle to determine the determined route. In another example, the one or more processors are further configured to: flag a plurality of problematic areas and draw a polygon around the plurality of problematic areas and the starting location.

DETAILED DESCRIPTION

Overview

Figure 1:
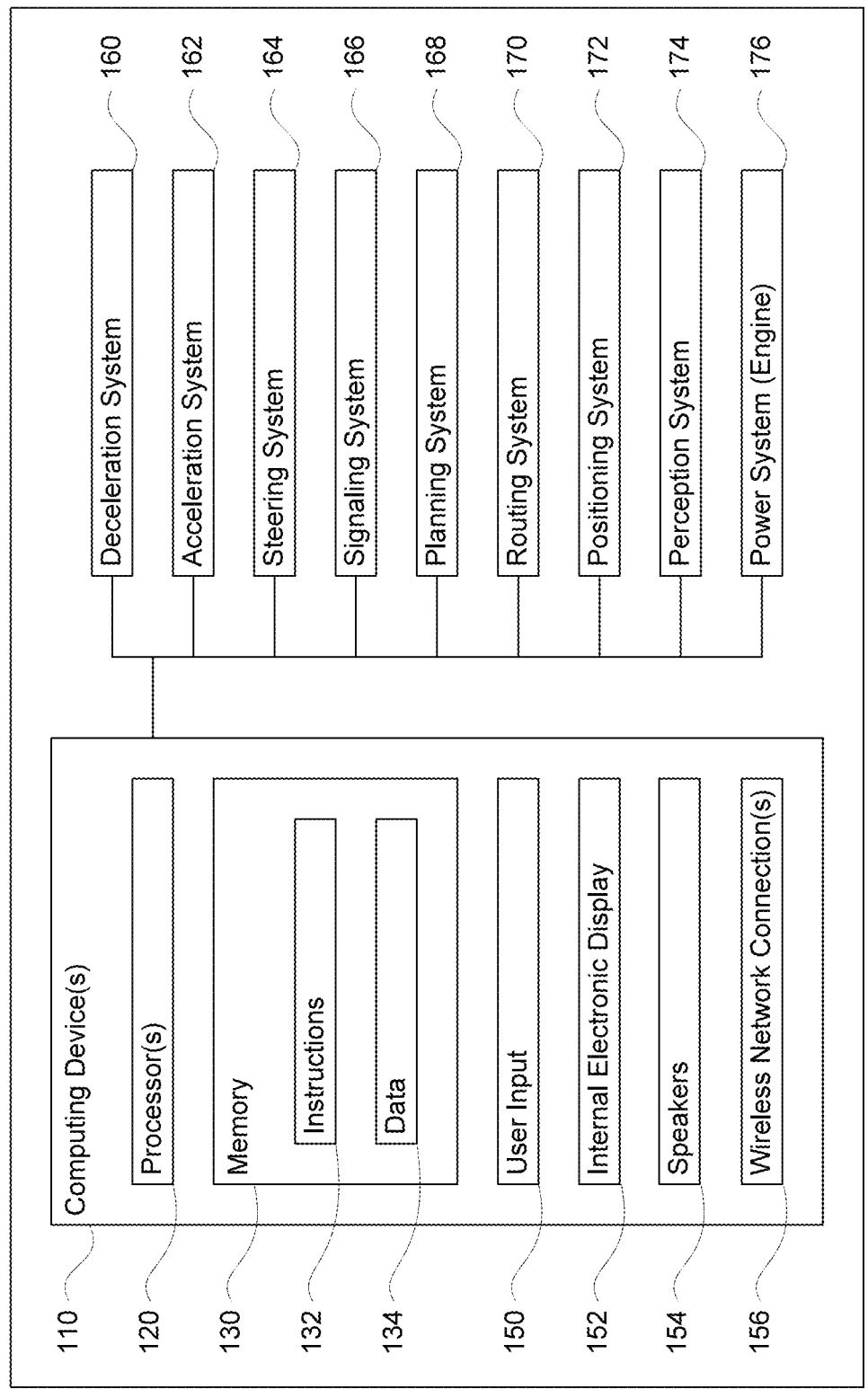
FIG. 1 is a functional diagram of an example vehicle in accordance with an exemplary embodiment.

The technology relates to assessing the viability of service areas for autonomous vehicles. This may allow for the identification of potential stranding situations where a vehicle is unable to reach its destination. For instance, certain maneuvers, such as lane changes in order to make turns, can be difficult for autonomous vehicles which may configured to avoid unsafe situations which human drivers may be willing to try. In addition, autonomous vehicles may be subject to geographical restrictions, for instance vehicles may need to remain within a service area, while human drivers typically would not be subject to such restrictions. Because of this, in some instances, an autonomous vehicle may become stranded because such vehicles may be programmed to avoid unsafe maneuvers and may no longer be able to make progress towards a destination due to geographical restrictions. If the vehicle is transporting cargo or passengers, this can lead to other issues. Again, in order to reduce such situations, a service area may be "tested" by running simulations to identify problematic areas.

In order to run the aforementioned simulations, a plurality of pickup and drop off locations may be identified. Each pickup location may represent a location for picking up passengers and/or cargo, and each drop off location may represent a destination or location for dropping off passengers and/or cargo. A plurality of starting locations for the simulations may be selected from the pickup and/or drop off locations. For each selected starting location, a plurality of destination locations may be selected from the plurality of pickup and/or drop off locations.

Each simulation may then be "run" by determining a route for each a pair of starting and destination locations. This may involve inputting each pair of starting and destination locations into a software stack of a routing system used by the autonomous vehicles. The routing system may determine an overall route between each starting location and destination location. Each of these routes may include particular types of maneuvers.

A subset of the simulations that include a particular type of maneuver may be identified. As an example, particular types of maneuvers may include, right and left turns, unprotected left turns, lane changes, multi-point turns, etc. For the subset of simulations, a plurality of new simulations may be run. Each of these new simulations may be run based on an assumption that the vehicle will be unable to complete the maneuver and will have to re-route itself to the destination of that simulation.

Any of the new simulations that do not reach the destination location may be identified. For each of the identified new simulations, the (original) selected starting location may be flagged as unable to reach the destination location. This information may help engineers visualize the practicality of a given service area.

The features described herein may be useful in assessing the viability of service areas or software-restricted maneuvers for autonomous vehicles. This may allow for the identification of potential stranding situations where a vehicle is unable to reach its destination, or where a vehicle is unlikely to reach its destination, and in turn, may be used to "carve-out" these areas. As a result, the number of strandings may be dramatically reduced and the passenger or user experience may be improved.

Example Systems

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing devices 110 containing one or more processors 120, memory 130 and other components typically present in general purpose computing devices.

The memory 130 stores information accessible by the one or more processors 120, including instructions 132 and data 134 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 132 may be any set of instructions to be executed directly (such as machine code) or indirectly (such as scripts) by the processor. For example, the instructions may be stored as computing device code on the computing device-readable medium. In that regard, the terms "software," "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 134 may be retrieved, stored or modified by processor 120 in accordance with the instructions 132. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110. Accordingly, references to a processor or computing device will be understood to include references to a collection of processors or computing devices or memories that may or may not operate in parallel.

Computing devices 110 may include all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio-visual experiences. In this regard, internal electronic display 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing devices 110 may be control computing devices of an autonomous driving computing system or incorporated into vehicle 100. The autonomous driving computing system may be capable of communicating with various components of the vehicle in order to control the movement of vehicle 100 according to the autonomous vehicle control software of memory 130 as discussed further below. For example, returning to FIG. 1, computing devices 110 may be in communication with various systems of vehicle 100, such as deceleration system 160, acceleration system 162, steering system 164, signaling system 166, planning system 168, routing system 170, positioning system 172, perception system 174, and power system 176 (i.e. the vehicle's engine or motor) in order to control the movement, speed, etc. of vehicle 100 in accordance with the instructions 132 of memory 130. Each of these systems may include various hardware (processors and memory similar to processors 120 and memory 130) as well as software, in order to enable these systems to perform various tasks. Again, although these systems are shown as external to computing devices 110, in actuality, these systems may also be incorporated into computing devices 110, again as an autonomous driving computing system for controlling vehicle 100.

As an example, computing devices 110 may interact with one or more actuators of the deceleration system 160 and/or acceleration system 162, such as brakes, accelerator pedal, and/or the engine or motor of the vehicle, in order to control the speed of the vehicle. Similarly, one or more actuators of the steering system 164, such as a steering wheel, steering shaft, and/or pinion and rack in a rack and pinion system, may be used by computing devices 110 in order to control the direction of vehicle 100. For example, if vehicle 100 is configured for use on a road, such as a car or truck, the steering system may include one or more actuators to control the angle of wheels to turn the vehicle. Signaling system 166 may be used by computing devices 110 in order to signal the vehicle's intent to other drivers or vehicles, for example, by lighting turn signals or brake lights when needed.

Planning system 168 may be used by computing devices 110 in order to determine and follow a route generated by a routing system 170 to a location. For instance, the routing system 170 may use map information to determine a route from a current location of the vehicle to a destination location. The planning system 172 may periodically generate trajectories, or short-term plans for controlling the vehicle for some period of time into the future, in order to follow the route to the destination. In this regard, the planning system 168, routing system 170, and/or data 134 may store detailed map information, e.g., highly detailed maps identifying the shape and elevation of roadways, lane lines, intersections, crosswalks, speed limits, traffic signals, buildings, signs, real time traffic information, vegetation, or other such objects and information.

Figure 2A:
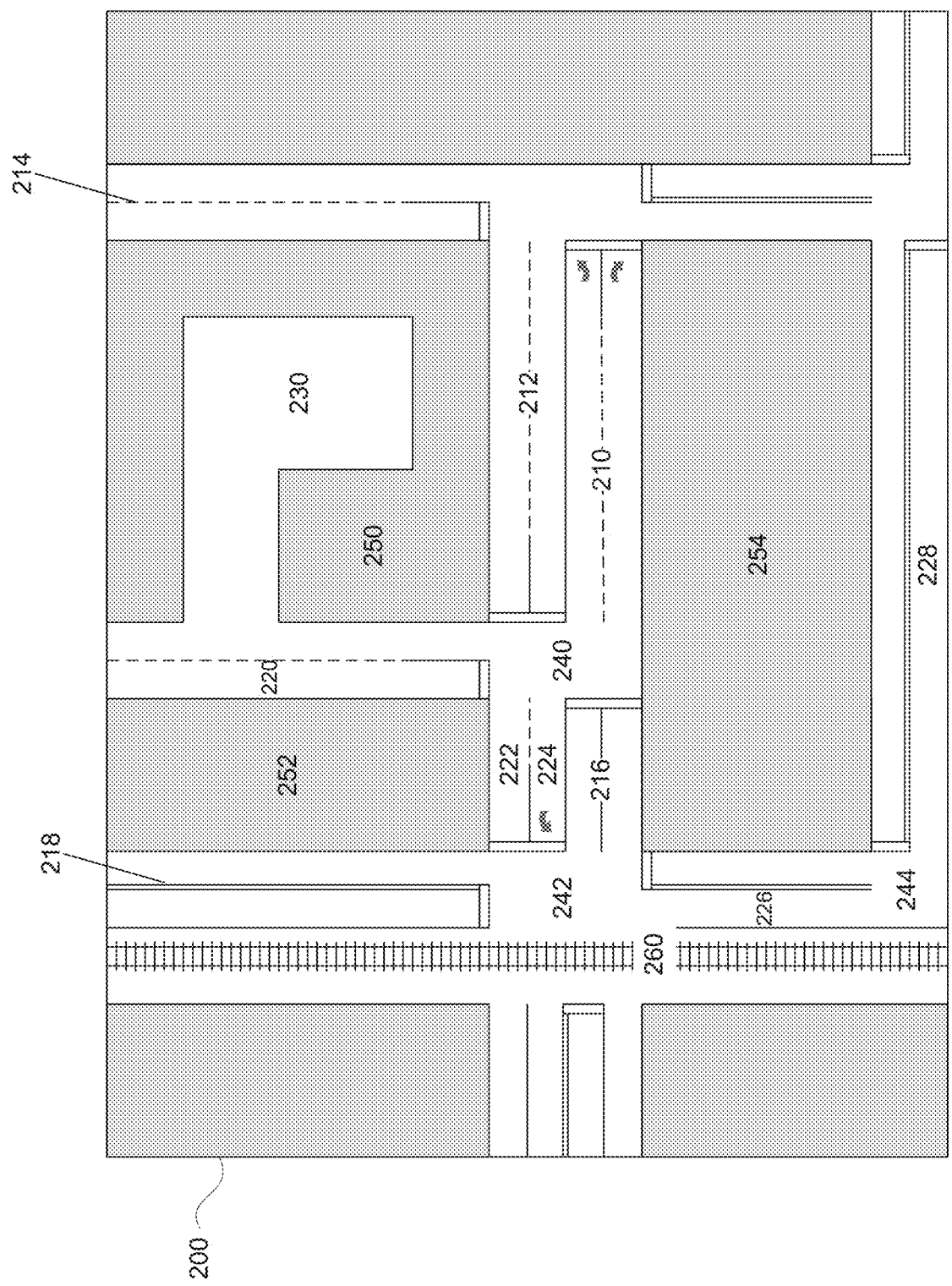
FIGS. 2A, 2B and 2C are an example of map information in accordance with aspects of the disclosure.
Figure 2B:
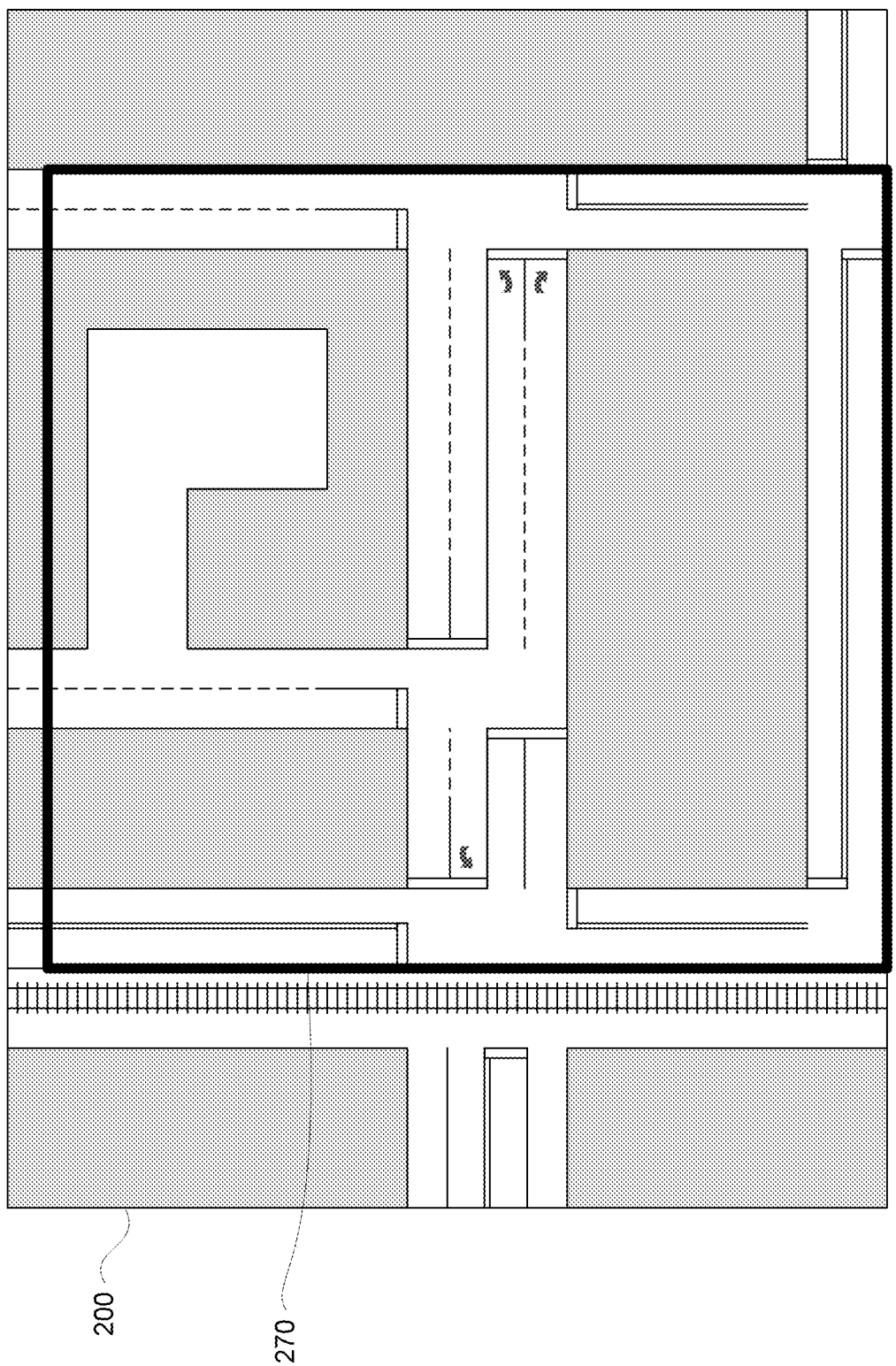
Figure 2C:
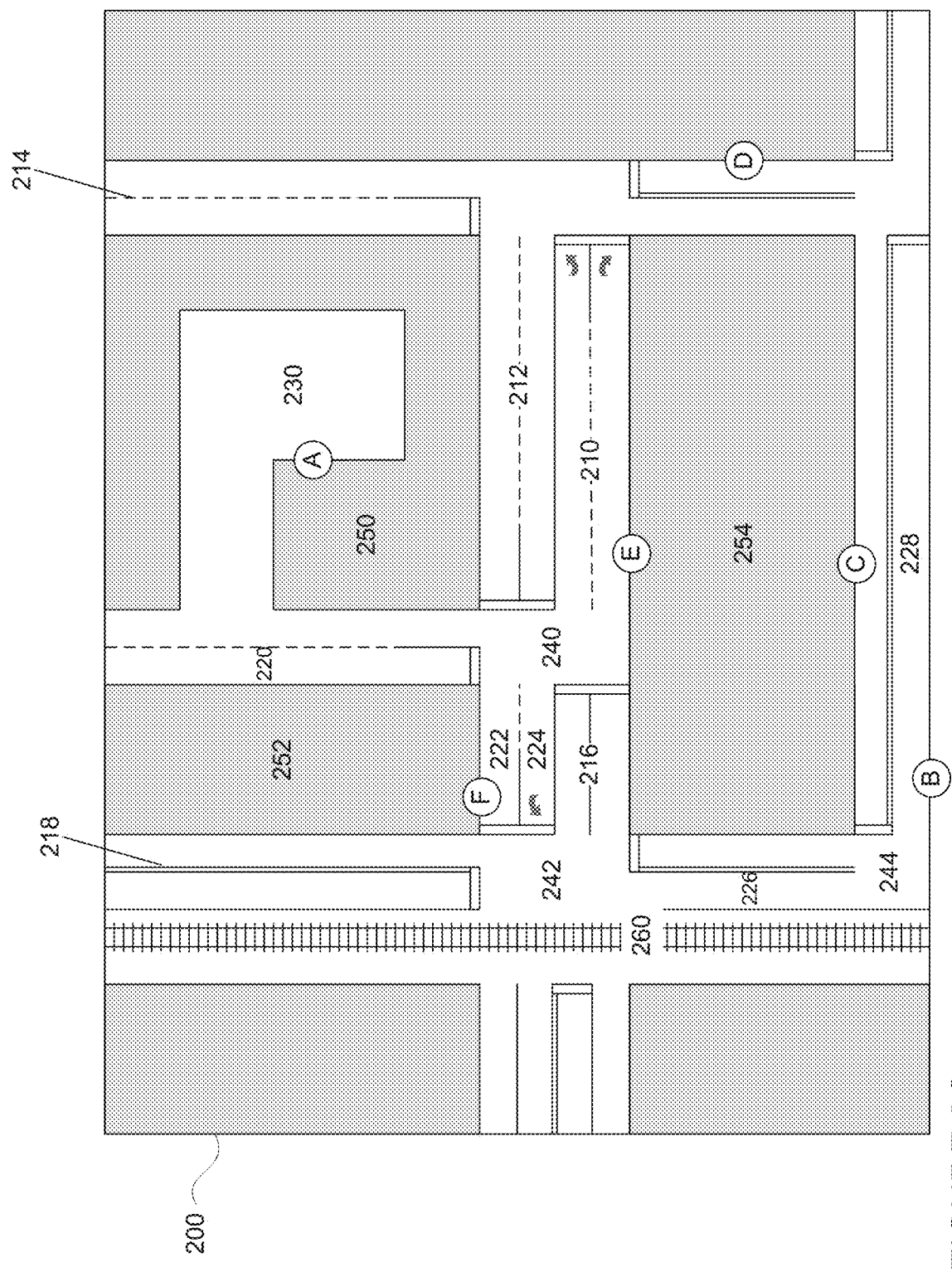

FIGS. 2A, 2B, and 2C are an example of map information 200 for a section of roadway corresponding to a service area for autonomous vehicles such as vehicle 100. Turning to FIG. 2A, the map information 200 includes information identifying the shape, location, and other characteristics of various features including lane lines represented by dashed-lines 210, 212, 214 and solid lines 216, 218. These lane lines may designate roads or otherwise drivable areas such as lanes 220, 222, 224, 226 and cul-de-sac 230. The map information also identifies intersections 240, 242, 244, non-drivable areas (such as buildings, parks, etc.) represented by shaded areas 250, 252, 254, as well as other features such as train tracks 260. Although only a few features are shown and identified, the map information 200 may be highly-detailed and include various additional features, including for instance the locations and boundaries of blockages as discussed further below.

As shown in FIG. 2B, the map information may also identify a boundary 270 for a service area. As shown, the boundary is a rectangular shape, but the boundary may be drawn as a polygon or any other shape and may be defined by physical or other types barrier or restrictions on the vehicles. This boundary may be fixed, for instance, because the vehicles may rely on maps and the boundary may differentiate between mapped and unmapped areas. The boundary may also be based on other restrictions for the vehicles, such as not crossing railroad tracks, not crossing through parking lots, not entering circles (or roundabouts), not making U-turns, etc. These restrictions may be encoded into the map information and/or an autonomous vehicle's routing system software module. For instance, map information can encode that one particular lane is problematic (e.g. there is a specific turn that the vehicle 100 is unable to accomplish), and the routing system can determine that some roads are problematic based on the contents of the map information (e.g. freeways have speed limits>45, so router disallows it) As an example, boundary 270 is defined in part by railroad tracks 260. In addition, in this example, the service area does not cover all of the map information 200, though in some instances, the extents of the map information may define the boundary.

Turning to FIG. 2C, the map information 200 may include a plurality of predetermined pickup and drop off locations A, B, C, D, E, F within the boundary 270 (not shown). For instance, each pickup location may represent a location for picking up passengers and/or cargo, and each drop off location may represent a destination or location for dropping off passengers and/or cargo. In many cases, a pickup location may also be a drop off location, and vice versa. In this regard, each of locations A, B, C, D, E, and F may represent either a pickup or drop off location or both. These pickup and/or drop off locations may be hand selected or automatically identified using a plurality of heuristics. For instance, pickup and/or drop off locations may only be on low speed roads (e.g. under 35 miles per hour), not in no stopping or standing zones (e.g. not in front of a fire hydrant), not in certain areas (e.g. on an on or off ramp for a highway), etc. In this regard, each of the pickup and/or drop off locations must be feasible, that is a reasonable location to pick up and drop off passengers, as well as "reachable", that is, part of the service area that is mapped.

Although the map information is depicted herein as an image-based map, the map information need not be entirely image based (for example, raster). For example, the map information may include one or more road graphs or graph networks of information such as roads, lanes, intersections, and the connections between these features. Each feature may be stored as graph data and may be associated with information such as a geographic location and whether or not it is linked to other related features, for example, a stop sign may be linked to a road and an intersection, etc. In some examples, the associated data may include grid-based indices of a road graph to allow for efficient lookup of certain road graph features.

Positioning system 172 may be used by computing devices 110 in order to determine the vehicle's relative or absolute position on a map or on the earth. For example, the position system 172 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 172 may also include other devices in communication with computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing devices 110, other computing devices and combinations of the foregoing.

Figure 3:
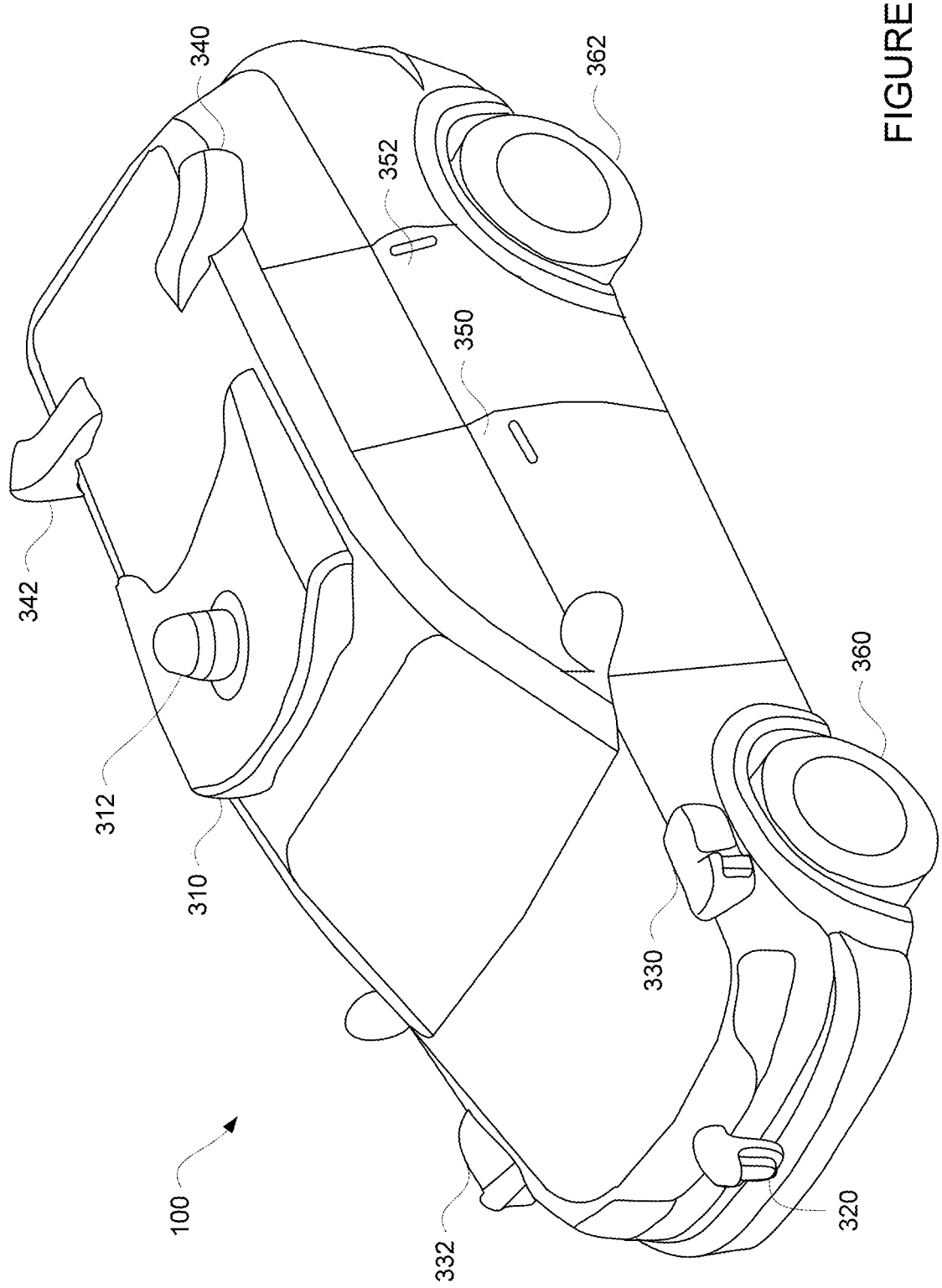
FIG. 3 is an example external view of a vehicle in accordance with aspects of the disclosure.

The perception system 174 also includes one or more components for detecting objects external to the vehicle such as other vehicles, obstacles in the roadway, traffic signals, signs, trees, etc. For example, the perception system 174 may include lasers, sonar, radar, cameras and/or any other detection devices that record data which may be processed by computing device 110. In the case where the vehicle is a passenger vehicle such as a minivan, the minivan may include a laser or other sensors mounted on the roof or other convenient location. For instance, FIG. 3 is an example external view of vehicle 100. In this example, roof-top housing 310 and dome housing 312 may include a LIDAR sensor as well as various cameras and radar units. In addition, housing 320 located at the front end of vehicle 100 and housings 330, 332 on the driver's and passenger's sides of the vehicle may each store a LIDAR sensor. For example, housing 330 is located in front of driver door 350. Vehicle 100 also includes housings 340, 342 for radar units and/or cameras also located on the roof of vehicle 100. Additional radar units and cameras (not shown) may be located at the front and rear ends of vehicle 100 and/or on other positions along the roof or roof-top housing 310. Vehicle 100 also includes many features of a typical passenger vehicle such as doors 350, 352, wheels 360, 362, etc.

The various systems of the vehicle may function using autonomous vehicle control software in order to determine how to and to control the vehicle. As an example, a perception system software module of the perception system 174 may use sensor data generated by one or more sensors of an autonomous vehicle, such as cameras, LIDAR sensors, radar units, sonar units, etc., to detect and identify objects and their characteristics. These characteristics may include location, type, heading, orientation, speed, acceleration, change in acceleration, size, shape, etc. In some instances, characteristics may be input into a behavior prediction system software module which uses various models based on object type to output a predicted future behavior for a detected object. In other instances, the characteristics may be put into one or more detection system software modules, such as a construction zone detection system software module configured to detect construction zones from sensor data generated by the one or more sensors of the vehicle as well as an emergency vehicle detection system configured to detect emergency vehicles from sensor data generated by sensors of the vehicle. Each of these detection system software modules may uses various models to output a likelihood of a construction zone or an object being an emergency vehicle. Detected objects, predicted future behaviors, various likelihoods from detection system software modules, the map information identifying the vehicle's environment, position information from the positioning system 172 identifying the location and orientation of the vehicle, a destination for the vehicle as well as feedback from various other systems of the vehicle (including a route generated by the routing system 170) may be input into a planning system software module of the planning system 168. The planning system may use this input to generate trajectories for the vehicle to follow for some brief period of time into the future. A control system software module of the computing devices 110 may be configured to control movement of the vehicle, for instance by controlling braking, acceleration and steering of the vehicle, in order to follow a trajectory.

The computing devices 110 may control the direction and speed of the vehicle autonomously by controlling various components. In order to do so, computing devices 110 may cause the vehicle to accelerate (e.g., by increasing fuel or other energy provided to the engine by acceleration system 162), decelerate (e.g., by decreasing the fuel supplied to the engine, changing gears, and/or by applying brakes by deceleration system 160), change direction (e.g., by turning the front or rear wheels of vehicle 100 by steering system 164), and signal such changes (e.g., by lighting turn signals of signaling system 166). Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 4:
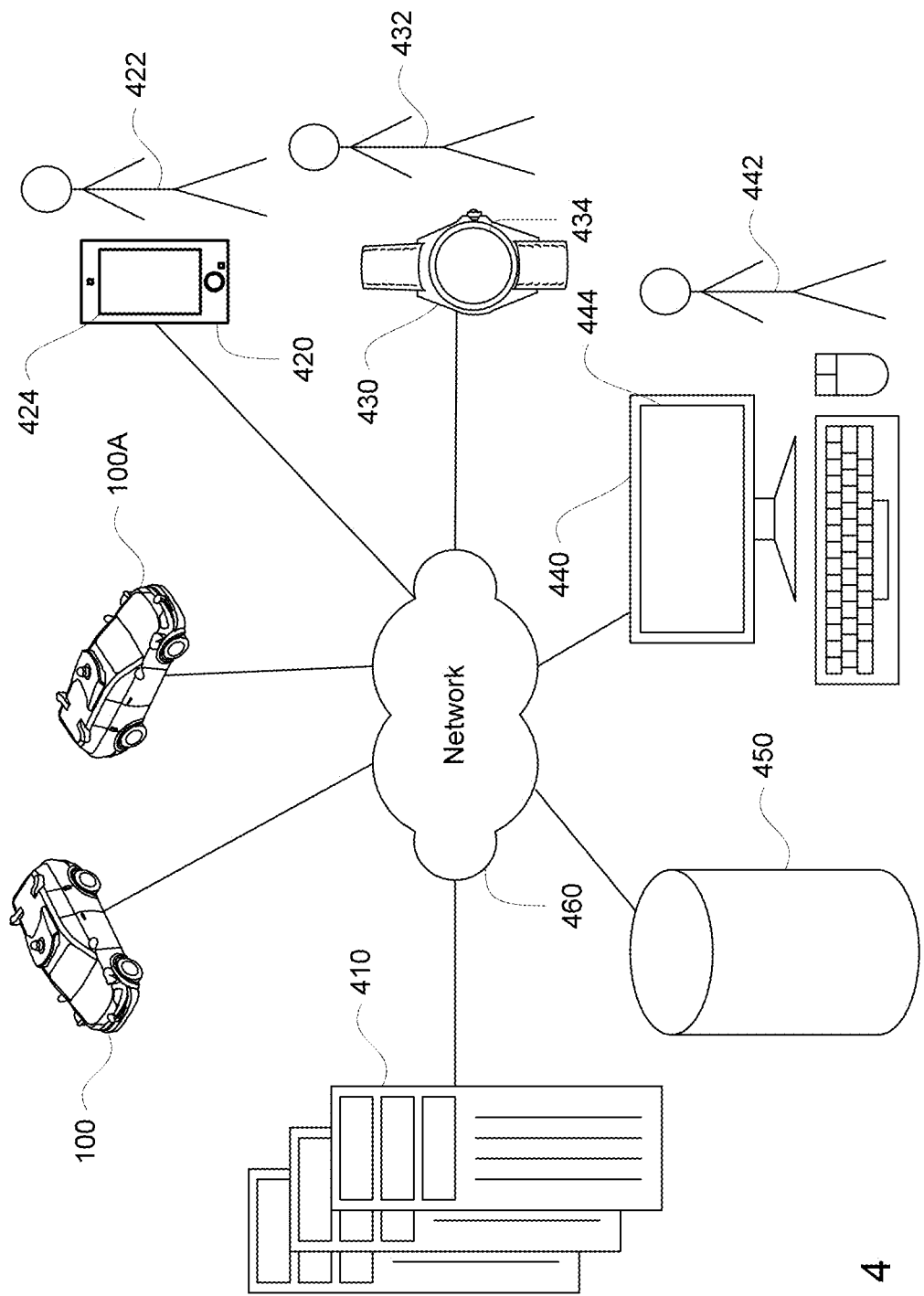
FIG. 4 is a pictorial diagram of an example system in accordance with aspects of the disclosure.
Figure 5:
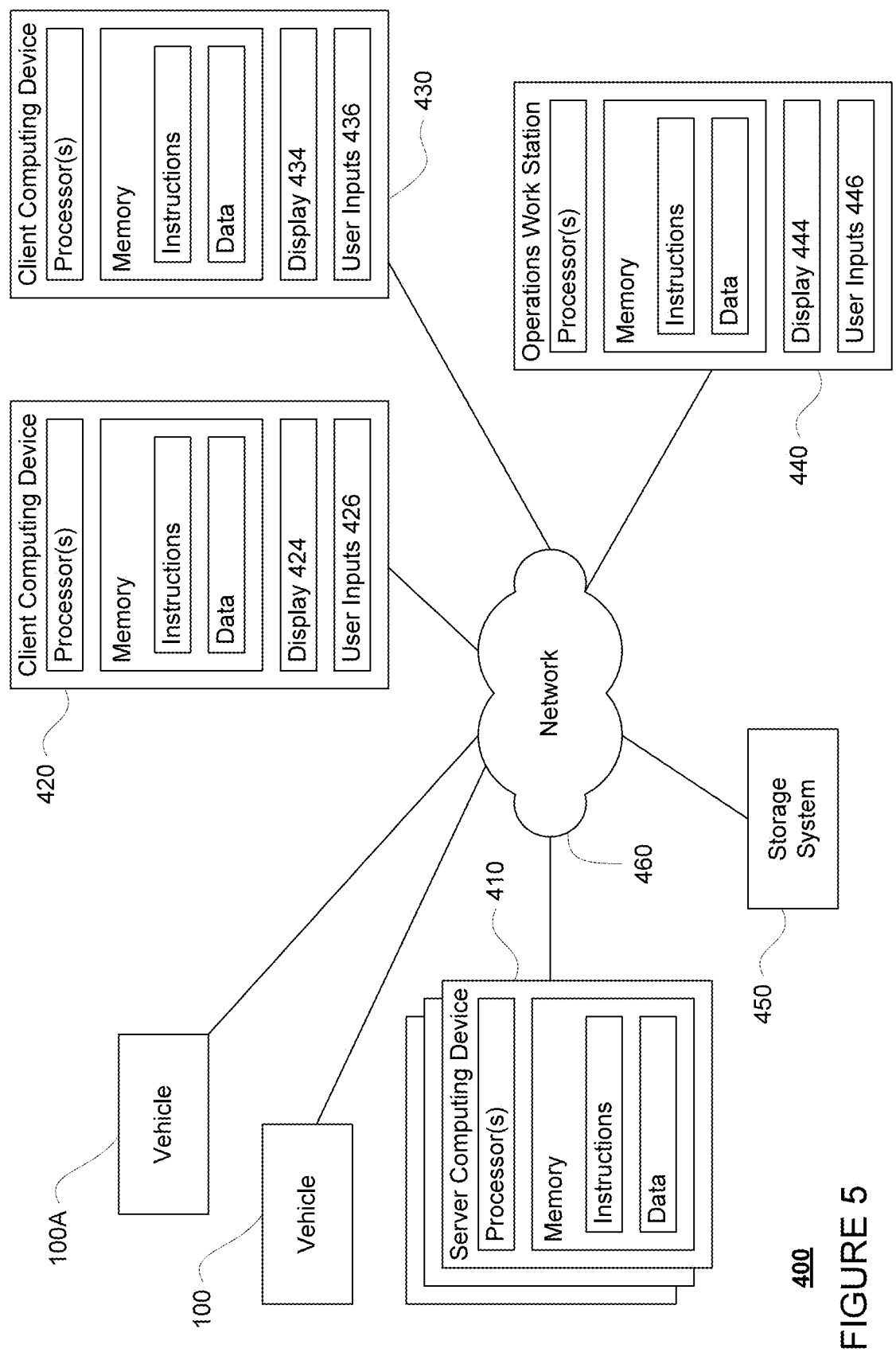
FIG. 5 is a functional diagram of the system of FIG. 4 in accordance with aspects of the disclosure.

Computing device 110 of vehicle 100 may also receive or transfer information to and from other computing devices, such as those computing devices that are a part of the transportation service as well as other computing devices. FIGS. 4 and 5 are pictorial and functional diagrams, respectively, of an example system 400 that includes a plurality of computing devices 410, 420, 430, 440 and a storage system 450 connected via a network 460. System 400 also includes vehicle 100 and vehicles 100A, which may be configured the same as or similarly to vehicle 100. Although only a few vehicles and computing devices are depicted for simplicity, a typical system may include significantly more.

As shown in FIG. 5, each of computing devices 410, 420, 430, 440 may include one or more processors, memory, data and instructions. Such processors, memories, data and instructions may be configured similarly to one or more processors 120, memory 130, data 134, and instructions 132 of computing device 110.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of vehicle 100 or a similar computing device of vehicle 100A as well as computing devices 420, 430, 440 via the network 460. For example, vehicles 100, 100A, may be a part of a fleet of vehicles that can be dispatched by server computing devices to various locations. In this regard, the server computing devices 410 may function as a dispatching server computing system which can be used to dispatch vehicles such as vehicle 100 and vehicle 100A to different locations in order to pick up and drop off passengers. In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 5, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 4. As an example, the user may input information using a small keyboard, a keypad, microphone, using visual signals with a camera, or a touch screen.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For instance, storage system 450 may store a version of map information 200 including boundary 270. Of course, as this boundary and/or the map information is updated, the version in the storage system 450 may also be updated.

The storage system 450 may also store a software stack or module for the aforementioned routing system 170 as well as historical trip information. The software module may be programmed in order to determine a route between two locations given the map information. In some instances, the software modules may be programmed to restrict certain types of maneuvers when determining a route, such as changing lanes in too short a distance, making a u-turn, etc.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

The technology relates to assessing the viability of service areas for autonomous vehicles. This may allow for the identification of potential stranding situations where a vehicle is unable to reach its destination. For instance, certain maneuvers, such as lane changes in order to make turns, can be difficult for autonomous vehicles which may configured to avoid risky or dangerous maneuvers which human drivers may be willing to try. As a result, an autonomous vehicle may become stranded. If the vehicle is transporting cargo or passengers, this can lead to other issues. Again, in order to reduce such situations, a service area may be "tested" by running simulations to identify problematic areas.

Figure 6:
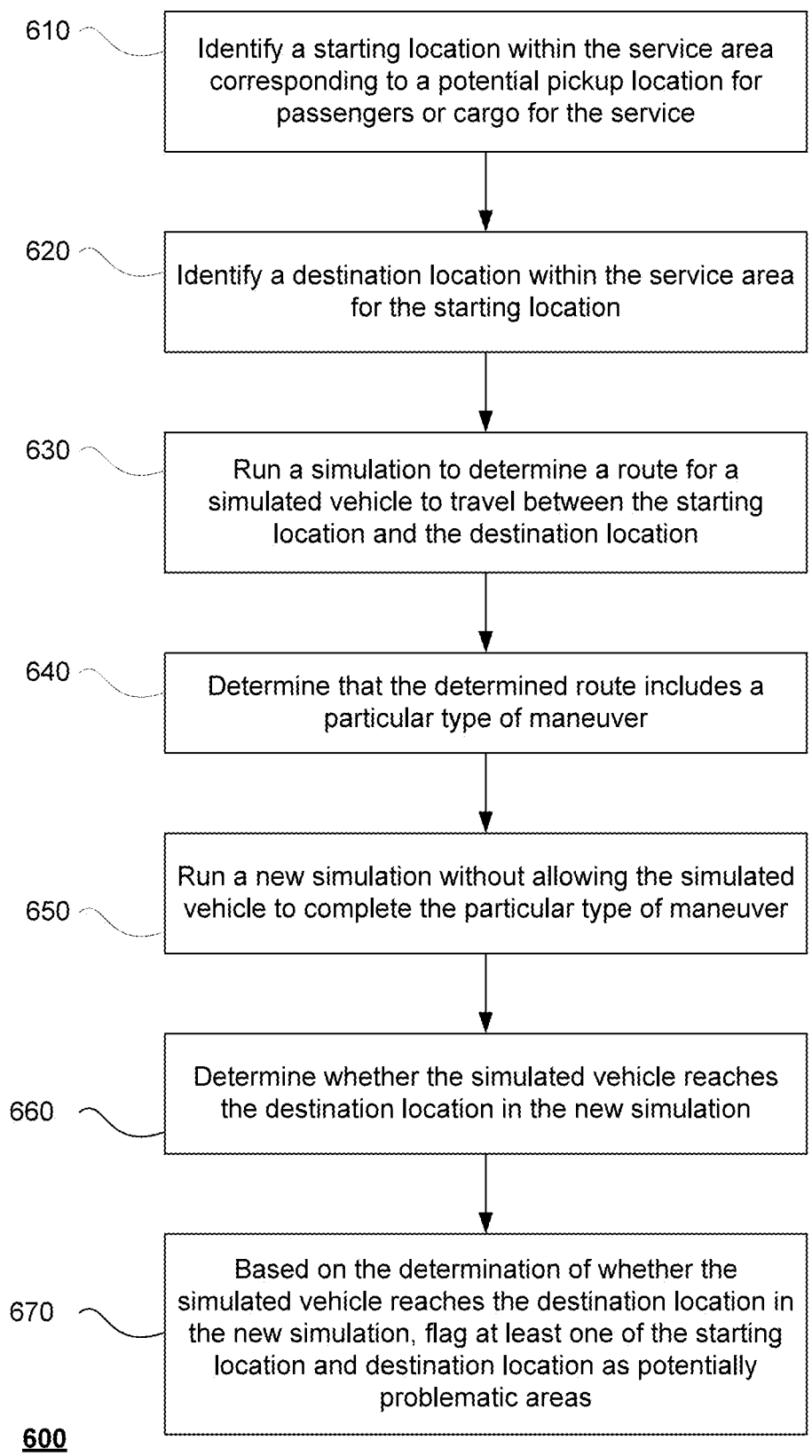
FIG. 6 is an example flow diagram in accordance with aspects of the disclosure.

FIG. 6 includes an example flow diagram 600 of some of the examples for identifying problematic areas within a service area, such as that defined by boundary 270, for an autonomous vehicle transportation service, which may be performed by one or more processors such as the processors of computing devices 410. For instance, at block 610, a starting location within the service area corresponding to a potential pickup location for passengers or cargo for the service may be identified. As an example, the starting location may be a pickup and/or a drop off location, such as any of locations A, B, C, D, E, and F of FIG. 2C.

A plurality of starting locations for the simulations may be selected from the pickup and/or drop off locations. For example, for a 10 square mile area, 10,000 of the pickup locations may be selected as starting locations. This selection may be random, or may focus on specific areas to be tested, such as a particular neighborhood, a newly mapped area, an area for which strandings have occurred previously, etc.

For each selected starting location, a plurality of destination locations may be selected from the plurality of pickup/drop off locations. For example, returning to FIG. 6, at block 620, a destination location within the service area is identified for the starting location. Returning to the example above, for each of the 10,000 selected pickup locations, 50 drop off locations may be selected as destination locations. In this regard, using the example numbers above, the total number of pairs of selected starting and destination locations for the simulations may be 500,000. Again, this selection may be random, or may focus on specific areas to be tested, such as a particular neighborhood, a newly mapped area, an area for which strandings have occurred previously, etc. For instance, location A may be selected as a pickup location, and may be paired with each of locations B, C, D, E, and F, or any subset therein, as drop off locations.

Figure 7:
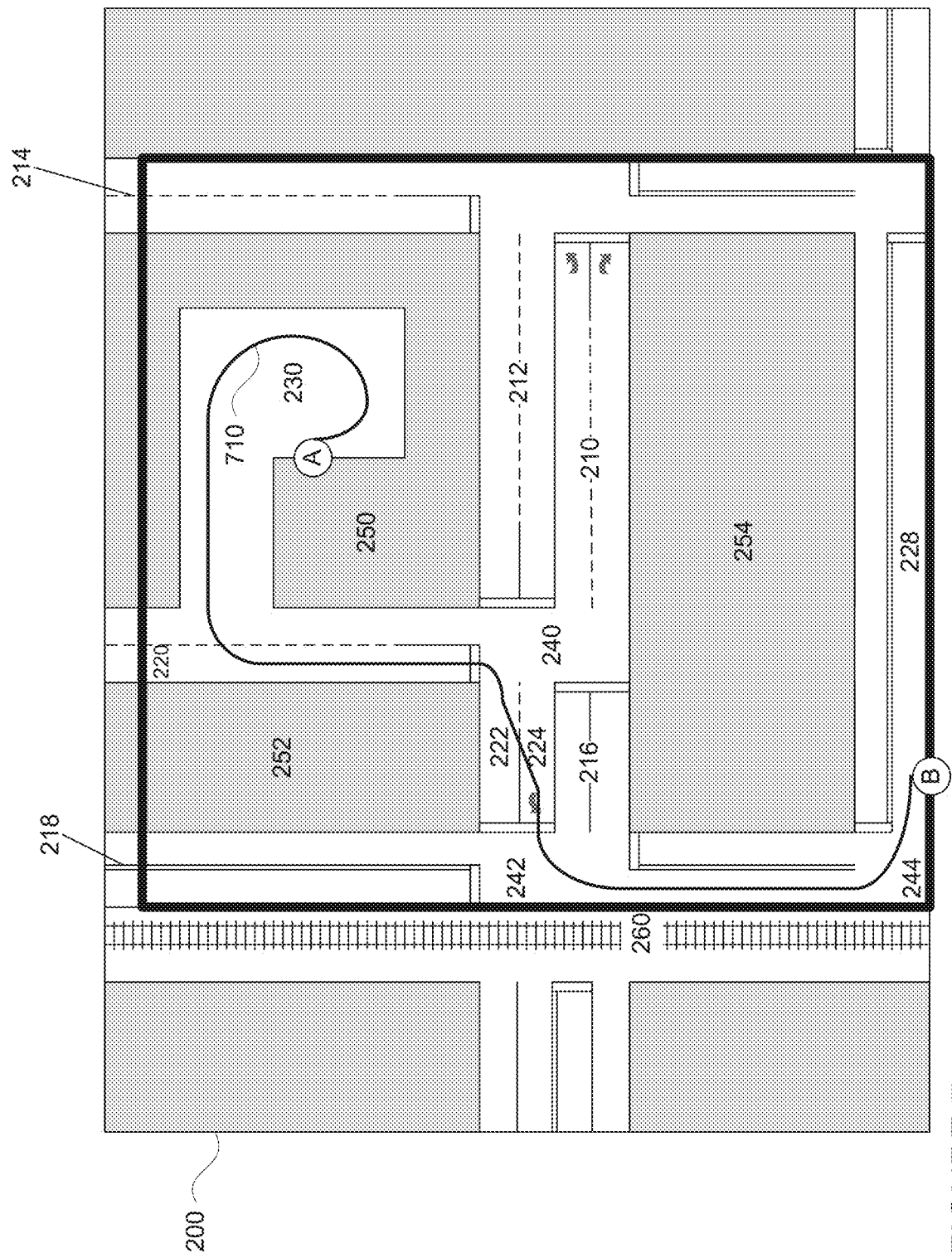
FIG. 7 is an example of map information and a route in accordance with aspects of the disclosure.

Each simulation may then be "run" by determining a route for each a pair of starting and destination locations. For instance, as shown in block 630 of FIG. 6, a simulation may be run in order to determine a route for a simulated vehicle to travel between the starting location and the destination location. As an example, a simulation may be run for each of the aforementioned 500,000 pairs or for A to B, A to C, A to D, A to E, and A to F. This may involve inputting each pair of starting and destination locations into the software stack of the routing system 170, used by the autonomous vehicles, such as that stored in storage system 450. The routing system may determine an overall route between each starting location and destination location. For instance, FIG. 7, depicts a route 710 between location A and location B.

Each of these routes may include particular types of maneuvers. These particular types of maneuvers may include, right and left turns, unprotected left turns, lane changes, multi-point turns, etc. For instance, route 710 includes a simulated (or actual) vehicle making an unprotected left turn out of the cul-de-sac into lane 220, a protected right turn into lane 222 at intersection 240, a lane change between lane 222 and lane 224, a protected left at intersection 242 into lane 224 (see FIG. 2A), and an unprotected left turn at intersection 244 into lane 228.

A subset of the simulations that include a particular type of maneuver may be identified. As shown in block 640 of FIG. 6, that the determined route includes a particular type of maneuver is determined. For instance, simulations, such as the simulation that generated route 710, that include lane changes or unprotected turns may be included in the subset. This subset may include all simulations having such maneuvers (e.g. all lane changes or all unprotected turns), or only a portion of those simulations which an autonomous vehicle is unlikely to be able to complete the maneuver. As an example, a model of lane change success rate may be used to select particular simulations having lane changes that a vehicle is unlikely to be able to complete. This model may identify lane changes that must occur within a certain distance (e.g. less than a half of a mile or more or less) or a certain amount of time (e.g. 60 seconds or more or less). In this regard, the model may might use features including the length of a lane change opportunity, time of day, etc. For example, model might estimate that the longer the lane change opportunity, the more likely it is for the lane change to be successful. The model itself may be a machine learned model trained using past successful and unsuccessful lane changes. Alternatively, the model could be a hand-tuned model.

For the subset of simulations, a plurality of new simulations may be run. For instance, as shown in block 650 of FIG. 6, a new simulation is run without allowing the simulated vehicle to complete the particular type of maneuver. Each of these new simulations may be run based on an assumption that the vehicle will be unable to complete the maneuver and will have to re-route itself to the destination of that simulation. For instance, for a starting and destination location pair of the subset, those starting and destination locations may remain fixed and a new simulation may be run by rerouting a simulated vehicle when the simulated vehicle has passed the location of the maneuver.

Figure 8:
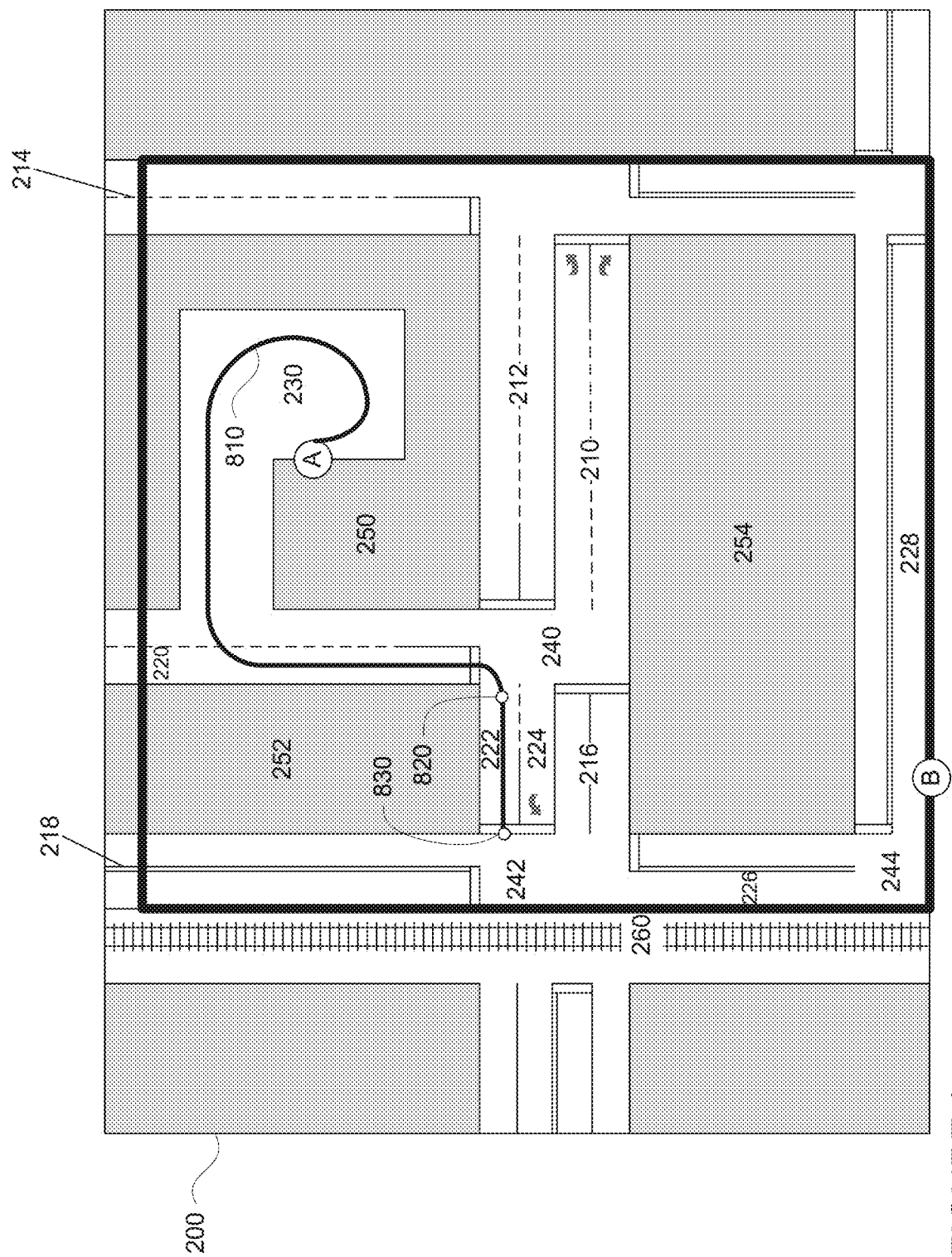
FIG. 8 is an example of map information and a route in accordance with aspects of the disclosure.

For example, a new simulation may be run that prohibits the routing system from allowing the lane change between lanes 222 and 224 along route 710. Turning to FIG. 8, at the point of the lane change in the route 710, the routing system would have to rely on an assumption that the lane change is not possible, and therefore re-route the vehicle to reach the location B. In this regard, the routing system may generate a new route 810. Up until location 820 on route 810, route 810 is the same as route 710. However, after location 820, the route does not continue to location B. In this regard, a simulated vehicle, for instance corresponding to vehicle 100, would be stopped at intersection 242 and becomes stranded at location 830. In other words, boundary 270 would prevent the simulated vehicle from crossing the railroad tracks 260 or making any further progress towards the location B. If anything, the simulated vehicle could make a right turn at intersection 242, but the vehicle would still be unable to reach or even make progress towards the location B.

Alternatively, the new simulations may be run by using a new starting location past the location of the maneuver and the destination location. In this regard, the destination location may be the original destination or rather, be unchanged from the original simulation. In other words, the route would start at location 820 (or some other location beyond location 820, such as further down lane 222 towards intersection 242) rather than at location A.

Any of the new simulations which do not result in the vehicle reaching the destination location may be identified. Returning to FIG. 6, whether the simulated vehicle reaches the destination location in the new simulation is determined at block 660. This may occur, for instance, if the simulated vehicle is unable to avoid leaving the service area (for instance, crossing a boundary as in the example of route 810 of FIG. 8) or making some other impermissible maneuver (for instance, making a U-turn).

For each of the identified new simulations, the (original) selected starting location may be flagged as unable to reach the destination location and the destination location may be flagged as being unreachable from the (original) selected starting location. For instance, at block 670, based on the determination of whether the simulated vehicle reaches the destination location in the new simulation, at least one of the starting location or the destination location is flagged potentially problematic areas. For example, these selected starting locations, such as location A, may be identified as "pins" on a map or may be used to generate a heat map of areas that are more or less likely to cause strandings or rather, locations where the vehicles are unable to make progress towards the destination or some other location. This information may help engineers visualize the practicality of a given service area.

In some instances, the number of new simulations that do not reach the destination for a particular selected starting location may be fairly high. In such cases, it may be useful to "carve-out" the areas of such selected starting locations or rather, prevent an autonomous vehicle from being able to pick up passengers or cargo within such areas. In order to do so, for each selected starting location, the number of new simulations (if any) that do not reach one of the destination locations for that selected starting location, may be compared to a threshold value. If the threshold value is or is not met, or rather if there are too many failures, the selected starting location and/or the destination location may be identified a problematic pickup location. For instance, if 50% (or more or less) of the new simulations for a selected starting location do not reach the destination location, this may indicate that the selected starting location is a problematic pickup location and that the destination location is also a problematic drop off location.

Figure 9:
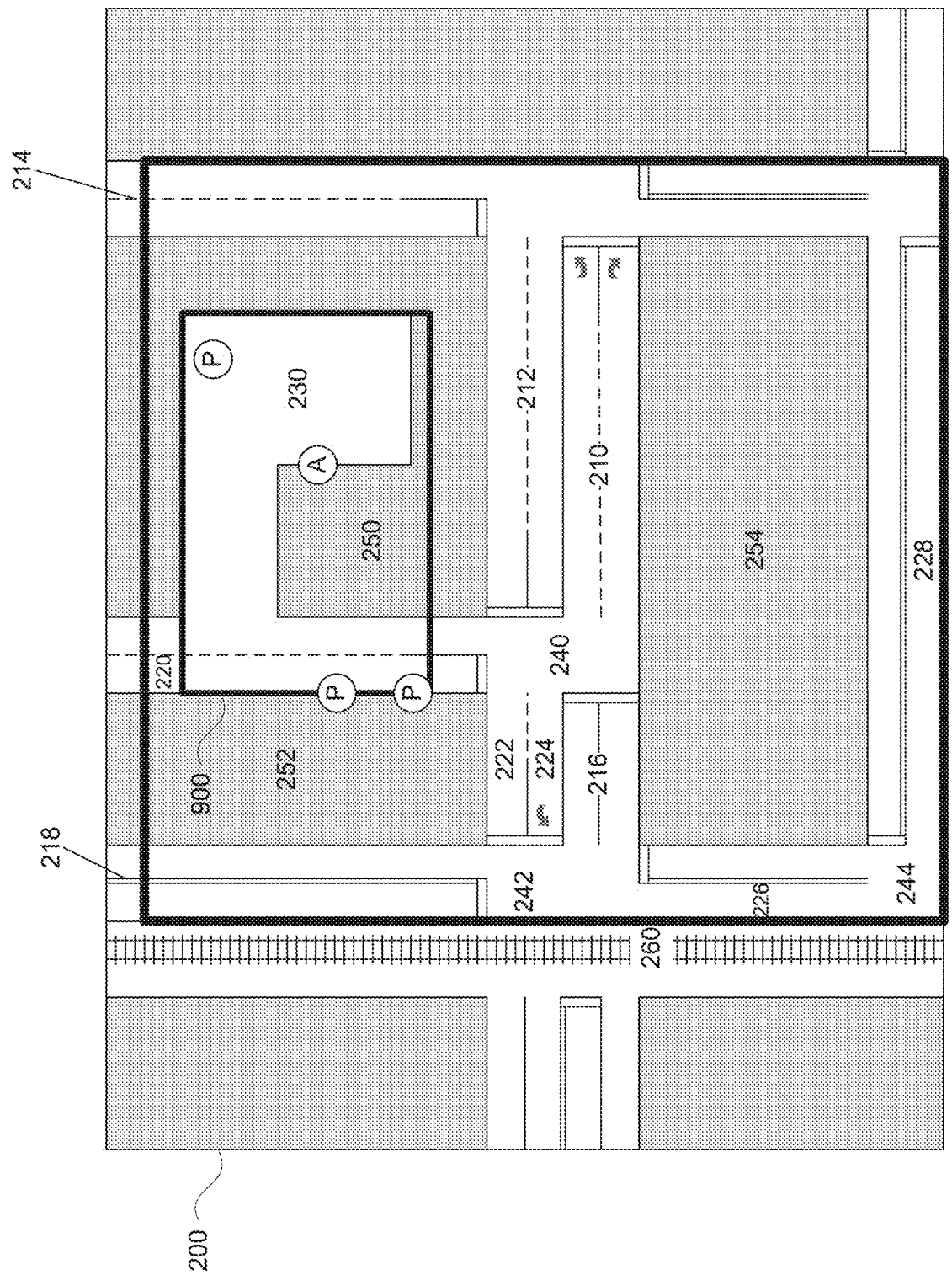
FIG. 9 is an example of map information, problematic locations, and a polygon in accordance with aspects of the disclosure.

A plurality of problematic pickup locations may be grouped together, for instance, by drawing a polygon around the problematic pickup locations. This drawing may be performed manually, or may be automated, by computing the smallest or other type of area that encompasses all of the problematic pickup locations within some distance of one another. For instance, FIG. 9 may include a plurality of pickup location that have been identified as problematic including location A and locations P. A polygon 900 has been drawn around these points, for instance, manually in order to "isolate" a problematic region of the map information for pickup and/or drop off locations. As another instance, the map may be divided into sections, such as fixed-sized squares or other grid cells. Then, the largest connected set of squares without any problematic pickup locations may be the largest contiguous service area that can be used without problems. Regardless of the method used, any isolated problematic regions can be subtracted away from the service area, so that vehicles are prevented from picking up passengers or cargo, or entering the problematic region for any reason. Therefore, since pickups or dropoffs or either are prevented in these isolated areas, autonomous vehicles may be less likely to encounter a stranding event.

The aforementioned simulations may be re-run as needed. For instance, each time the service area is updated or problematic regions are disallowed, the simulations may be re-run to determine the second-order effects of making those changes. Similarly, the simulations may be re-run each time the service area (or rather, if boundary 270), the routing system, and/or the map information is changed or updated. For instance, changes to the software stack of the routing system may result in the increased ability of a vehicle to perform a particular maneuver or may completely change the route that the routing system generates.

The features described herein may be useful in assessing the viability of service areas or software-restricted maneuvers for autonomous vehicles. This may allow for the identification of potential stranding situations where a vehicle is unable to reach its destination, or where a vehicle is unlikely to reach its destination, and in turn, may be used to "carve-out" these areas. As a result, the number of strandings may be dramatically reduced and the passenger or user experience may be improved.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of identifying problematic areas within a service area for an autonomous vehicle transportation service, the method comprising:
   identifying, by one or more processors, a starting location within the service area;
   identifying, by the one or more processors, a destination location within the service area;
   running, by the one or more processors, a first simulation to determine a first route for a simulated vehicle to travel between the starting location and the destination location;
   determining, by the one or more processors, that the first route includes performance of a particular type of maneuver at a given location that the simulated vehicle is unlikely to be able to complete;
   based on a determination by the one or more processors that the first route includes the performance of the particular type of maneuver at the given location that the simulated vehicle is unlikely to be able to complete, running, by the one or more processors, a second simulation to determine a second route for the simulated vehicle to travel between at least the given location and the destination location,
wherein:
the second route does not include the performance of the particular type of maneuver at the given location that the simulated vehicle is unlikely to be able to complete, and
the second route is different from the first route;
determining, by the one or more processors, whether the simulated vehicle reaches the destination location in the second simulation; and
based on a determination by the one or more processors that the simulated vehicle does not reach the destination location in the second simulation, flagging, by the one or more processors, at least one of the starting location or the destination location as potentially problematic areas.

2. The method of claim 1, wherein the second route is the same as the first route between the starting location and the given location.

3. The method of claim 1, wherein the particular type of maneuver is an unprotected left turn.

4. The method of claim 1, wherein the particular type of maneuver is a right or left turn onto a road having multiple lanes.

5. The method of claim 1, wherein the particular type of maneuver is a multi-point turn.

6. The method of claim 1, wherein the particular type of maneuver is changing lanes.

7. The method of claim 1, wherein the service area includes a boundary across which the simulated vehicle is unable to cross, and wherein determining whether the simulated vehicle reaches the destination location in the second simulation is based on whether the simulated vehicle becomes stranded by the boundary.

8. The method of claim 1, wherein the starting location is identified by randomly selecting a location within the service area.

9. The method of claim 1, wherein the starting location is identified from a plurality of predetermined pickup and drop off locations within the service area.

10. The method of claim 9, wherein the starting location is identified from the plurality of predetermined pickup and drop off locations randomly.

11. The method of claim 9, wherein the starting location is identified from the plurality of predetermined pickup and drop off locations within a specific portion of the service area.

12. The method of claim 1, wherein the destination location is identified from a plurality of predetermined pickup and drop off locations within the service area.

13. The method of claim 1, wherein a length of time for the simulated vehicle to perform the particular type of maneuver at the given location results in the simulated vehicle being unlikely to be able to complete the performance of the particular type of maneuver at the given location.

14. The method of claim 1, wherein a distance for the simulated vehicle to perform the particular type of maneuver at the given location results in the simulated vehicle being unlikely to be able to complete the performance of the particular type of maneuver at the given location.

15. The method of claim 1, wherein the second simulation results in the simulated vehicle being unable to avoid leaving the service area.

16. The method of claim 1, wherein the second simulation results in the simulated vehicle performing an impermissible maneuver.

17. A system for identifying problematic areas within a service area for an autonomous vehicle transportation service, the system comprising:
one or more computing devices having one or more processors configured to:
identify a starting location within the service area;
identify a destination location within the service area;
run a first simulation to determine a first route for a simulated vehicle to travel between the starting location and the destination location;
determine that the first route includes performance of a particular type of maneuver at a given location that the simulated vehicle is unlikely to be able to complete;
based on a determination that the first route includes the performance of the particular type of maneuver at the given location that the simulated vehicle is unlikely to be able to complete, run a second simulation to determine a second route for the simulated vehicle to travel between at least the given location and the destination location,
wherein:
the second route does not include the performance of the particular type of maneuver at the given location that the simulated vehicle is unlikely to be able to complete, and
the second route is different from the first route;
determine whether the simulated vehicle reaches the destination location in the second simulation; and
based on a determination that the simulated vehicle does not reach the destination location in the second simulation, flag at least one of the starting location or the destination location as potentially problematic areas.

18. The system of claim 17,
wherein the second route is the same as the first route between the starting location and the given location.

19. The system of claim 17, wherein being configured to determine that the first route includes a particular type of maneuver comprises being configured to:
determine that the first route includes an unprotected left turn.

20. The system of claim 17, wherein being configured to determine that the first route includes a particular type of maneuver comprises being configured to:
determine that the first route includes a right or left turn onto a road having multiple lanes.

21. The system of claim 17, wherein being configured to determine that the first route includes a particular type of maneuver comprises being configured to:
determine that the first route includes a multi-point turn.

22. The system of claim 17, wherein being configured to determine that the first route includes a particular type of maneuver comprises being configured to:
determine that the first route includes changing lanes.

23. The system of claim 17, wherein being configured to determine whether the simulated vehicle reaches the destination location in the second simulation comprises being configured to:
determine whether the simulated vehicle becomes stranded by a boundary of the service area which the simulated vehicle is not allowed to cross.

24. A method of identifying problematic areas within a service area for an autonomous vehicle transportation service, the method comprising:
- identifying, by one or more processors, a starting location within the service area;
- identifying, by the one or more processors, a destination location within the service area;
- running, by the one or more processors, a first simulation to determine a first route for a simulated vehicle to travel between the starting location and the destination location;
- determining, by the one or more processors, that the first route includes performance of a particular type of maneuver at a given location that the simulated vehicle is unlikely to be able to complete;
- based on a determination by the one or more processors that the first route includes the performance of the particular type of maneuver at the given location that the simulated vehicle is unlikely to be able to complete, running, by the one or more processors, a second simulation to determine a second route for the simulated vehicle to travel between the starting location and the destination location without allowing the simulated vehicle to complete the particular type of maneuver at the given location that the simulated vehicle is unlikely to be able to complete,
- wherein:
  - the second route being the same as the first route between the starting location and the given location, and
  - the second route is different from the first route;
- determining, by the one or more processors, whether the simulated vehicle reaches the destination location in the second simulation; and
- based on a determination by the one or more processors that the simulated vehicle does not reach the destination location in the second simulation, flagging, by the one or more processors, at least one of the starting location or the destination location as potentially problematic areas.

* * * * *